United States Patent
Park et al.

(10) Patent No.: US 9,200,200 B2
(45) Date of Patent: Dec. 1, 2015

(54) PHOSPHOR, LIGHT EMITTING DEVICE, SURFACE LIGHT SOURCE DEVICE, DISPLAY DEVICE AND ILLUMINATION DEVICE

(75) Inventors: Woo-Jung Park, Osan-si (KR);
Bong-Goo Yun, Chuncheon-si (KR);
Won-Young Song, Seoul (KR);
Jeong-Eun Yun, Suwon-si (KR);
Tae-Min Ahn, Incheon (KR); Chul-Soo Yoon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 227 days.

(21) Appl. No.: 14/118,324

(22) PCT Filed: May 18, 2012

(86) PCT No.: PCT/KR2012/003972
§ 371 (c)(1),
(2), (4) Date: Nov. 18, 2013

(87) PCT Pub. No.: WO2012/157998
PCT Pub. Date: Nov. 22, 2012

(65) Prior Publication Data
US 2014/0104874 A1  Apr. 17, 2014

(30) Foreign Application Priority Data
May 19, 2011 (KR) .................. 10-2011-0047509

(51) Int. Cl.
*C09K 11/77* (2006.01)
*F21V 9/16* (2006.01)
(Continued)

(52) U.S. Cl.
CPC ......... *C09K 11/7783* (2013.01); *C09K 11/0883* (2013.01); *C09K 11/7728* (2013.01);
(Continued)

(58) Field of Classification Search
CPC .......... C09K 11/7783; C09K 11/7728; C09K 11/0883; C09K 11/7734; H01L 33/502; F21V 9/16
USPC .................................................. 362/84, 97.1
See application file for complete search history.

(56) References Cited

U.S. PATENT DOCUMENTS 6,657,379 B2   12/2003  Ellens et al.
7,597,821 B2   10/2009  Sakuma et al.
(Continued)

FOREIGN PATENT DOCUMENTS

JP   2002-363554   12/2002
JP   2003-336059   11/2003
(Continued)

OTHER PUBLICATIONS

Sakuma, K., et al., "Luminescence properties of (Ca, Y)—α—SiAlON:Eu phosphors", ScienceDirect, Materials Letters 61 (2007) p. 547-550, © 2006 Elsevier B.V.
(Continued)

*Primary Examiner* — David V Bruce
(74) *Attorney, Agent, or Firm* — Onello & Mello, LLP

(57) ABSTRACT

There are provided a phosphor, a light emitting device, a surface light source device, a display device and an illumination device. The phosphor includes an α-type $Si_3N_4$ crystal structure and includes oxynitride represented by an empirical formula $Ca_xEu_yM_zSi_{12-(m+n)}Al_{n+m}O_nN_{16-n}$, wherein M is at least one selected from a group consisting of Sr, Lu, La and Ba, and satisfies $0.5 \leq x \leq 1.1$, $0.00005 \leq y \leq 0.09$, $1.0 \leq m \leq 3.6$, $0.001 \leq n \leq 0.2$, and $0.00001 \leq z \leq 0.1$.

16 Claims, 14 Drawing Sheets

(51) Int. Cl.
  *H01L 33/50* (2010.01)
  *C09K 11/08* (2006.01)
  *F21V 8/00* (2006.01)

(52) U.S. Cl.
  CPC .............. *C09K11/7734* (2013.01); *F21V 9/16* (2013.01); *G02B 6/0011* (2013.01); *H01L 33/502* (2013.01); *Y02B 20/181* (2013.01)

(56) References Cited

U.S. PATENT DOCUMENTS

| | | | |
|---|---|---|---|
| 8,294,848 B2* | 10/2012 | Cho | G02F 1/133617 349/112 |
| 2003/0030038 A1 | 2/2003 | Mitomo et al. | |
| 2003/0030368 A1 | 2/2003 | Ellens et al. | |
| 2007/0246732 A1 | 10/2007 | Sakuma et al. | |
| 2010/0237767 A1 | 9/2010 | Emoto et al. | |
| 2010/0244067 A1* | 9/2010 | Winkler | C04B 35/62813 257/98 |
| 2011/0133629 A1 | 6/2011 | Sakata et al. | |
| 2011/0279018 A1 | 11/2011 | Emoto et al. | |
| 2012/0270049 A1 | 10/2012 | Emoto et al. | |
| 2013/0193600 A1 | 8/2013 | Emoto et al. | |

FOREIGN PATENT DOCUMENTS

| | | |
|---|---|---|
| JP | 2006-257326 | 9/2006 |
| JP | 3914991 | 2/2007 |
| JP | 4288047 | 4/2009 |
| KR | 10-0772047 | 10/2007 |
| KR | 10-2011-0004916 | 1/2011 |
| KR | 10-2011-0016493 | 2/2011 |
| WO | 2010/087348 | 8/2010 |

OTHER PUBLICATIONS

International Preliminary Report on Patentability dated Nov. 19, 2013 issued in International Application No. PCT/KR2012/003972.
Sakuma, K., et al., "Luminescence properties of (Ca, Y)-α-SiAION:Eu phosphors", ScienceDirect, Materials Letters 61 (2007) p. 547-550, © 2006 Elsevier B.V.
International Search Report dated Dec. 12, 2012 issued in corresponding International Application No. PCT/KR2012/003972.

* cited by examiner

PHOSPHOR, LIGHT EMITTING DEVICE, SURFACE LIGHT SOURCE DEVICE, DISPLAY DEVICE AND ILLUMINATION DEVICE

CROSS-REFERENCE TO RELATED APPLICATIONS

This application is a 371 national stage entry of PCT/KR2012/003972 filed on May 18, 2012 which claims priority under 35 U.S.C. §119(b) to Korean Patent Application No. 10-2011-0047509 filed on May 19, 2011. The contents of each of which are incorporated herein by reference in their entirety.

BACKGROUND

1. Field

Aspects of embodiments relate to a phosphor, a light emitting device, a surface light source device, a display device and an illumination device.

2. Description of the Related Art

In general, a phosphor wavelength conversion material has been used as a material converting light having a certain wavelength emitted by various light sources into light having a desired wavelength. In particular, among various light sources, light emitting diodes (LEDs) are able to be driven with low power consumption and have excellent light efficiency, and thus may be effectively applied to liquid crystal display (LCD) backlight units, vehicle lighting systems, and home lighting systems. Recently, phosphor materials have been recognized as a core technology in the manufacturing of white light emitting devices.

White light emitting devices have been generally manufactured in a scheme in which at least one or more types of phosphor, for example, a yellow or red phosphor and a blue phosphor, are applied to a blue or ultraviolet LED chip. In particular, when a red phosphor is combined with a different one or more types of phosphors to then be used, it may be difficult to secure a sufficient color rendering index in a case in which a full width at half maximum of a respective phosphor is relatively low, and there may be limitations in implementing desired natural white light. The color rendering properties required as above may be important evaluation terms when white light emitting devices are employed as light sources for illumination devices.

The white light emitting devices have been generally manufactured in a scheme of coating blue LEDs with yellow phosphors. In detail, light emission surfaces of blue LEDs having GaN/InGaN active layers are coated with yellow phosphors of YAG ($Y_3Al_5O_{12}$):Ce to thus convert a portion of blue light into yellow, and converted yellow and a different portion of blue light are then combined to thereby provide white light. White light emitting devices according to the related art configured of the YAG:Ce phosphors (or TAG-based phosphors) and the blue LEDs as described above have relatively low color rendering properties. That is, since wavelengths of white light obtained using yellow phosphors are only distributed in blue and yellow and thus color rendering properties are relatively low, there are limitations in implementing desired natural white light. In addition, in the case of a silicate phosphor according to the related art, as a yellow phosphor, the phosphor is unstable with the application of heat and may thus be unsuitable to be used for high output LED chips.

In order to improve defects as above, α-SiAlON-based phosphors have been proposed, and α-SiAlON-based phosphors are known as being able to emit long wavelength light as compared to YAG:Ce phosphors (see Japanese Patent Laid-Open Publication No. 2002-363554 or the like). Such α-SiAlON-based phosphors have relatively excellent thermal stability, but have relatively low light emission efficiency as compared to that of YAG:Ce phosphors. Accordingly, a scheme for increasing light emission efficiency of α-SiAlON-based phosphors has been required.

SUMMARY

An aspect of an embodiment provides a high brightness α-SiAlON-based phosphor having improved light emission efficiency.

An aspect of an embodiment provides a white light emitting device, a surface light source device, an illumination device and a display device using the phosphor described above.

According to an aspect of the inventive concept, there is provided a phosphor including an α-type $Si_3N_4$ crystal structure and including oxinitride represented by an empirical formula $Ca_xEu_yM_zSi_{12-(m+n)}Al_{n+m}O_nN_{16-n}$, wherein M is at least one element selected from a group consisting of Sr, Lu, La and Ba, and satisfies $0.5 \leq x \leq 1.1$, $0.00005 \leq y \leq 0.09$, $1.0 \leq m \leq 3.6$, $0.001 \leq n \leq 0.2$, and $0.00001 \leq z \leq 0.1$.

M may include two or more types of elements selected from the group, and all of the two or more types of elements may satisfy $0.00001 \leq z \leq 0.1$.

M may be Sr and may satisfy $0.00001 \leq z \leq 0.05$.
M may be Ba and may satisfy $0.00001 \leq z \leq 0.1$.
M may be Lu and may satisfy $0.00001 \leq z \leq 0.04$.

According to an aspect of the inventive concept, there is provided a white light emitting device including: a light emitting device emitting excitation light; a phosphor disposed in the vicinity of the light emitting device to convert a wavelength of at least a portion of the excitation light and including the empirical formula of at least one of claims 1 to 5; and at least one light emitting element emitting a wavelength of light different from that of the light emitting device and the phosphor and provided by at least one of an additional light emitting device and a different type of phosphor.

The white light emitting device may further include a package body including a groove part in which the light emitting device is mounted.

The white light emitting device may further include a resin encapsulation unit encapsulating the light emitting device, and at least one of the phosphor and the different type of phosphor may be distributed within the resin encapsulation unit.

The phosphor and the different type of phosphor may respectively form a plurality of different phosphor-containing resin layers, and the plurality of phosphor-containing resin layers may have a stacked structure.

The phosphor may be provided in ceramic plate form.

According to an aspect of the inventive concept, there is provided a surface light source device using, as a wavelength converting material, the phosphor described above.

According to an aspect of the inventive concept, there is provided a surface light source device including: a light guide plate; and a light source module disposed on at least one side of the light guide plate to provide light to an inside of the light guide plate, wherein the light source module includes a circuit board and a plurality of white light emitting devices mounted on the circuit board and using, as a wavelength converting material, the phosphor described above.

According to an aspect of the inventive concept, there is provided a display device using, as a wavelength converting material, the phosphor described above.

According to an aspect of the inventive concept, there is provided a display device including: an image display panel displaying an image; and a backlight unit providing light to the image display panel and including the surface light source device described above.

According to an aspect of the inventive concept, there is provided an illumination device using, as a wavelength converting material, the phosphor described above.

According to an aspect of the inventive concept, there is provided an illumination device including: a light source module; and a diffusion sheet disposed on the light source module and allowing light incident from the light source module to be uniformly diffused thereon, wherein the light source module includes a circuit board and a plurality of white light emitting devices mounted on the circuit board and using, as a wavelength converting material, the phosphor described above.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION OF EMBODIMENTS

Figure 1:
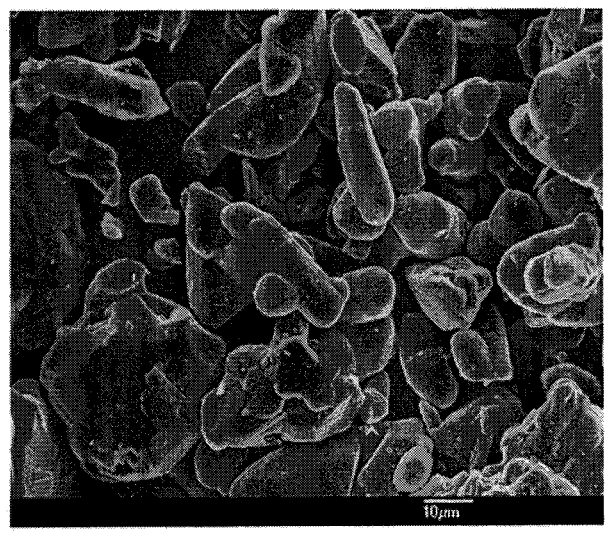
FIGS. 1 to 5 are images captured using a scanning electron microscope (SEM), illustrating forms of metal element particles used for α-SiAlON-based phosphors.

Embodiments will now be described in detail with reference to the accompanying drawings.

Embodiments may, however, be embodied in many different forms and should not be construed as being limited to embodiments set forth herein. Rather, these embodiments are provided so that this disclosure will be thorough and complete, and will fully convey the scope of the inventive concept to those skilled in the art. In the drawings, the shapes and dimensions of elements may be exaggerated for clarity, and the same reference numerals will be used throughout to designate the same or like elements.

A phosphor according to an embodiment may have an α-type $Si_3N_4$ crystal structure and include oxynitride represented by an empirical formula $Ca_xEu_yM_zSi_{12-(m+n)}Al_{n+m}O_nN_{16-n}$, wherein the empirical formula may satisfy the following conditions.

(1) M is at least one selected from a group consisting of Sr, Lu, La and Ba
(2) $0.5 \leq x \leq 1.1$
(3) $0.5 \leq y \leq 0.09$
(4) $1.0 \leq m \leq 3.6$
(5) $0.001 \leq n \leq 0.2$
(6) $0.00001 \leq z \leq 0.1$ The phosphor according to the embodiment may be an α-SiAlON-based phosphor obtained by adding all of Ca and M (at least one selected from a group consisting of Sr, Lu, La and Ba) together with Eu, an active agent, to a SiAlON host lattice having an α-type $Si_3N_4$ crystal structure. The α-SiAlON-based phosphor may be a phosphor exhibiting light emissions having a yellow region using ultraviolet light or blue light as excitation light and may be used in white light emitting devices due to having relatively excellent thermal stability. The α-SiAlON-based phosphor may be obtained using a method of weighing and mixing respective materials using a silicon nitride powder, an aluminum nitride powder, a calcium carbonate powder and a europium oxide powder as initial materials, in a predetermined amount thereof, to then be sintered at a high temperature under the atmosphere of $N_2$ or the like.

In the case of the α-SiAlON-based phosphor, $Ca^{2+}$ ions having a relatively small size may be employed in an empty sphere of a host matrix, and in detail, in the case of the present embodiment, Sr, Lu, La and Ba may be co-doped in addition to using Ca. In addition, further improved light emission efficiency as compared with an existing α-SiAlON-based phosphor may be obtained by allowing an M element co-doped with Ca to be provided in a suitable amount thereof.

Figure 2:
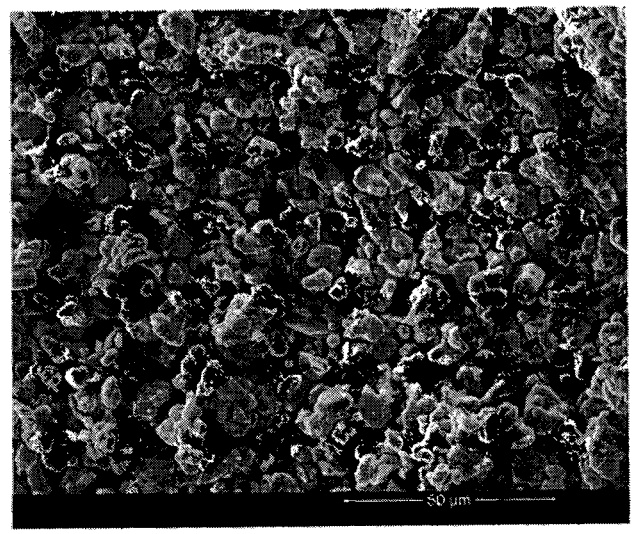
Figure 3:
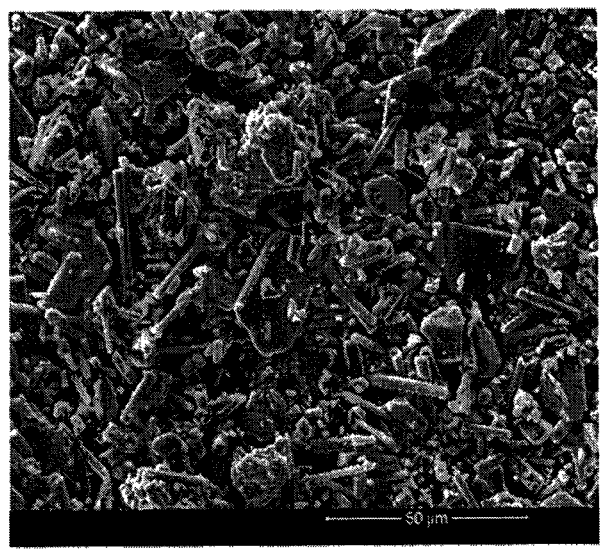
Figure 4:
Figure 5:
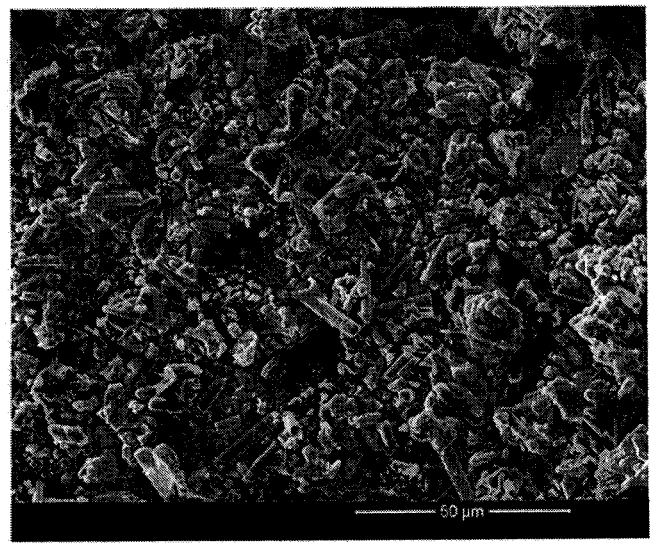

FIGS. 1 to 5 are images captured using a scanning electron microscope (SEM), illustrating forms of metal element particles used in α-SiAlON-based phosphors. In this case, a basic composition of the α-SiAlON-based phosphor may be $Ca_{0.875}Eu_{0.03}Si_{12-(m+n)}Al_{n+m}O_nN_{16-n}$. Here, FIG. 1 illustrates a state in which only Ca is employed therein, that is, a phosphor of a composition not including M, FIG. 2 illustrates a phosphor of a composition in which Lu is included under the condition of z=0.005, FIG. 3 illustrates a phosphor of a composition in which Sr is included under the condition of z=0.03, FIG. 4 illustrates a phosphor of a composition in which Sr is included under the condition of z=0.3, and FIG. 5 illustrates a phosphor of a composition in which Ba is included under the condition of z=0.03.

Figure 6:
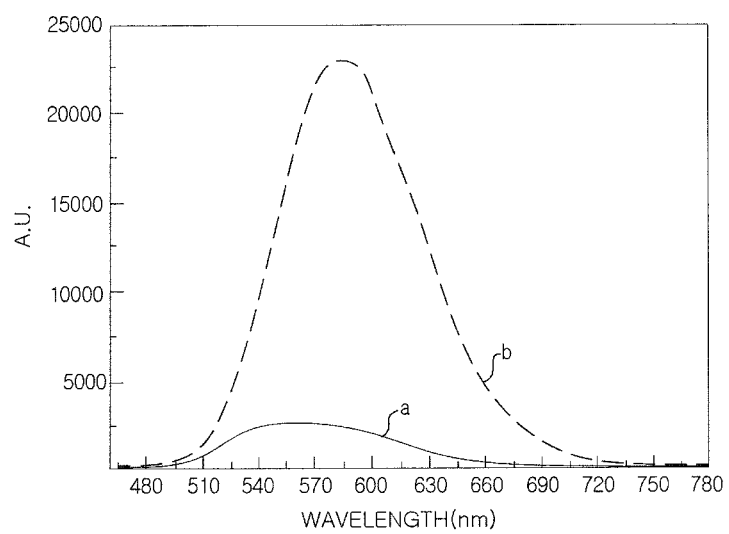
FIG. 6 is a graph illustrating light emission spectra of two types of phosphors added in amounts different from those of metal elements used in an α-SiAlON-based phosphor.

FIG. 6 is a graph illustrating light emission spectra of two types of phosphors having different amounts of metal elements added to the α-SiAlON-based phosphor. In FIG. 6, 'a' refers to a phosphor of a composition in which an amount x of Ca is 0.28 and metal element M is not added, and 'b' refers to a phosphor of a composition in which an addition amount x of Ca is 0.875 and an addition amount z of Sr is 0.02. As illustrated in FIG. 6, light emission characteristics may be excellent in the case in which the phosphor of the composition proposed according to the present embodiment and particularly Sr are included. Hereinafter, an influence depending on a type and an addition amount of a metal element used in the α-SiAlON-based phosphor will be described in more detail.

Figure 7:
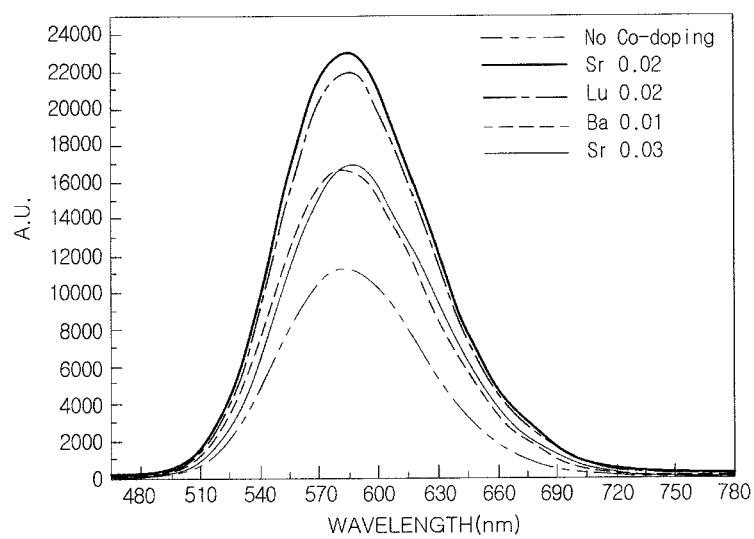
FIG. 7 is a graph illustrating light emission spectra depending on metal elements used in an α-SiAlON-based phosphor.

FIG. 7 is a graph illustrating light emission spectra depending on metal elements used in an α-SiAlON-based phosphor. In this case, when a metal element M is not separately added, a basic composition may be $Ca_{0.875}Eu_{0.03}Si_{12-(m+n)}Al_{n+m}O_nN_{16-n}$ as per the foregoing description. With reference to FIG. 7, it may be appreciated that the α-SiAlON-based phosphor has a yellow light emission peak and light emission characteristics are improved in the case of being used together with Sr, Lu and Ba as compared with a case in which Ca is only used. In more detail, for example, the most excellent light emission characteristics were exhibited in the case of the phosphor of the composition in which Sr was included under the condition of z=0.02. Hereinafter, an α-SiAlON-based phosphor composition will be described through light emission characteristics depending on the content of a metal element M used in the α-SiAlON-based phosphor. In this case, a basic composition of the α-SiAlON-based phosphor including the metal element M added thereto may be $Ca_{0.875}Eu_{0.03}Si_{12-(m+n)}Al_{n+m}O_nN_{16-n}$.

Figure 8:
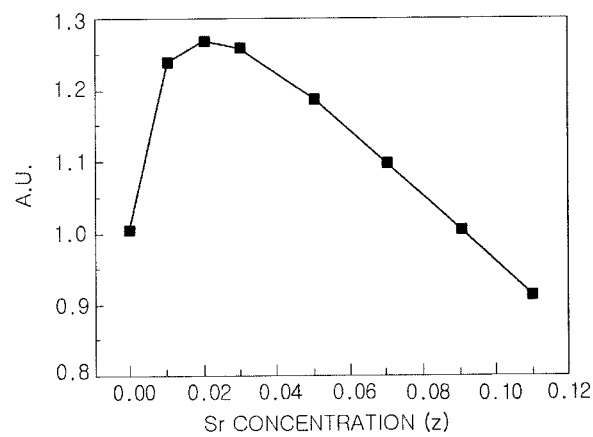
FIG. 8 is a graph illustrating light emission characteristics depending on an amount of Sr added to an α-SiAlON-based phosphor.

FIG. 8 is a graph illustrating light emission characteristics depending on an amount of Sr added to an α-SiAlON-based phosphor and results obtained by measuring brightness by applying a phosphor to a package. In this case, the comparison of light emission characteristics is carried out through the case in which Sr is added to an α-SiAlON-based phosphor as described above and a case of a composition in which Sr is not added. With reference to FIG. 8, when Sr is added together with Ca, light emission characteristics through phosphors provided in a light emitting device may be improved and may be further improved in terms of a composition in which an amount of Sr is around 0.02. Then, brightness may be reduced according to an increase in the amount of Sr, and it can be appreciated that when the amount of Sr is greater than around 0.05, a reduction in brightness is relatively great. Therefore, the amount of Sr may be within a range of $0.00001 \leq z \leq 0.05$.

Figure 9:
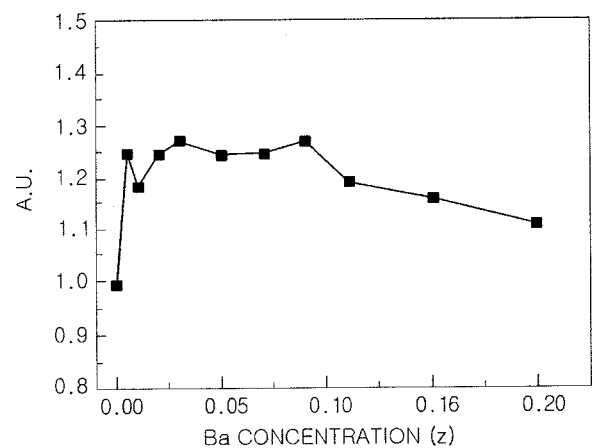
FIG. 9 is a graph illustrating light emission characteristics depending on an amount of Ba added to an α-SiAlON-based phosphor.

FIG. 9 is a graph illustrating light emission characteristics depending on an amount of Ba added to an α-SiAlON-based phosphor and results obtained by measuring brightness by applying a phosphor to a package. In this case, the comparison of light emission characteristics is carried out through the case in which Ba is added to an α-SiAlON-based phosphor as described above and a case of a composition in which Ba is not added. With reference to FIG. 9, when Ba is added together with Ca, light emission characteristics through phosphors provided in the light emitting device may be improved and may be further improved in a composition in which an amount of Ba is around 0.02 to 0.03. Then, brightness may be maintained at a comparatively constant level thereof according to an increase in the amount of Ba. Thereafter, it can be appreciated that when the amount of Ba is greater than around 1.0, a reduced degree of brightness is relatively great. Therefore, the amount of Ba may be within a range of $0.00001 \leq z \leq 0.1$.

Figure 10:
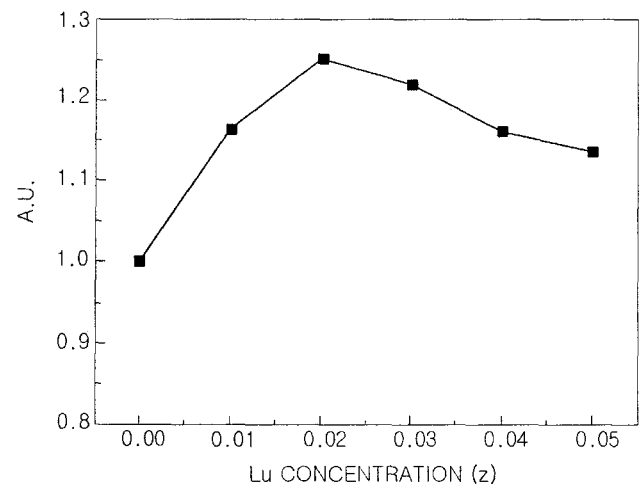
FIG. 10 is a graph illustrating light emission characteristics depending on an amount of Lu added to an α-SiAlON-based phosphor.

FIG. 10 is a graph illustrating light emission characteristics depending on an amount of Lu added to an α-SiAlON-based phosphor and results obtained by measuring brightness by applying a phosphor to a package. In this case, the comparison of light emission characteristics is carried out through the case in which Lu is added to an α-SiAlON-based phosphor as described above and a case of a composition in which Lu is not added. With reference to FIG. 10, when Lu is added together with Ca, light emission characteristics through phosphors provided in the light emitting device may be improved and may be further improved in a composition in which an amount of Lu is around 0.02. Then, it can be appreciated that brightness is reduced according to an increase in the amount of Lu and a reduced extent of brightness is relatively great in a case in which the amount of Lu is greater than around 0.03. Therefore, the amount of Lu may be within a range of $0.00001 \leq z \leq 0.03$.

Figure 11:
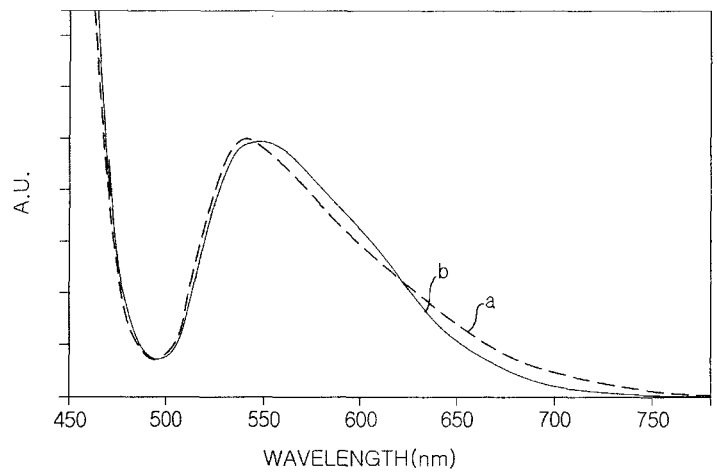
FIG. 11 is a graph illustrating light emission spectra of an α-SiAlON-based phosphor according to an embodiment and a phosphor of a comparative example.

FIG. 11 is a graph illustrating light emission spectra of an α-SiAlON-based phosphor according to an embodiment and a phosphor of a comparative example. In this case, 'a' refers a phosphor proposed according to an embodiment of the inventive concept and has a composition of $Ca_{0.875}Eu_{0.03}Sr_{0.02}Si_{12-(m+n)}Al_{n+m}O_nN_{16-n}$, while 'b' refers to a silicate-based yellow phosphor according to the related art. With reference to FIG. 11, it can be appreciated that although the α-SiAlON-based phosphor according to the embodiment shows a light emission spectrum similar to the silicate-based phosphor, a yellow region is further reinforced.

As such, when as a metal element, Sr, Lu, La or Ba is added, together with Ca, to the α-SiAlON-based phosphor in a range of an addition amount suitable therefor as in the embodiments as above, excellent light emission characteristics may be provided while maintaining yellow light emission characteristics. In addition, the phosphors as described above may be widely used in light emitting devices, display devices, and the like to be described below.

Figure 12:
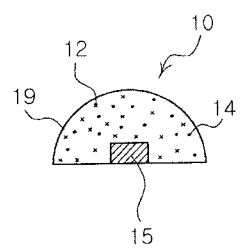
FIGS. 12 to 14 are schematic views of white light emitting devices according to respective embodiments.
Figure 13:
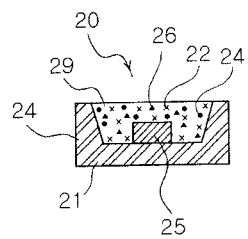
Figure 14:
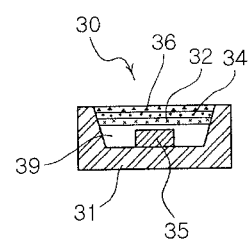

FIGS. 12 to 14 are schematic views of white light emitting devices according to respective embodiments. First, as shown in FIG. 12, a white light emitting device 10 according to the present embodiment may include a blue LED chip 15 and a resin encapsulation unit 19 encapsulating the blue LED chip 15 and having an upwardly convex lens shape. The resin encapsulation unit 19 used according to the present embodiment may have a hemispherical lens shape so as to secure relatively wide directivity. The blue LED chip 15 may be directly mounted on a separate circuit board. The resin encapsulation unit 19 may be formed of the silicon rein described above, an epoxy resin or a combination thereof. Inside the resin encapsulation unit 19, as at least one wavelength converting material, for example, a yellow phosphor 12 may be included, and in addition to the yellow phosphor 12, phosphors 14 emitting peak wavelengths of green, red or the like may be distributed.

As the yellow phosphor 12 employable according to the present embodiment, as described above, the α-SiAlON-based phosphor in which Ca and a metal element, that is, M, are used together may be used. In addition, when as the phosphor 14, a green phosphor is used, a β-SiAlON phosphor, an oxinitride phosphor represented by an empirical formula $M_xA_yO_xN_{(4/3)y}$, or oxinitride represented by $M_aA_bO_cN_{((2/3)a+(4/3)b-(2/3)c)}$, may be used as a phosphor. Here, M may be at least one group II element selected from a group consisting of Be, Mg, Ca, Sr and Zn, A may be at least one group IV element selected from a group consisting of C, Si, Ge, Sn, Ti, Zr and Hf. In addition, when as the phosphor 14, a red phosphor is used, at least one selected from a nitride-based phosphor of $M1AlSiN_x:Re(1 \leq x \leq 5)$, sulfide-based phosphor of M1D:Re and a silicate-based phosphor of $(Sr,L)_2SiO_{4-x}N_y:Eu$ (here, 0<x<4 and y=2x/3) may be used. Here, M1 may be at least one element selected from Ba, Sr, Ca and Mg, and D may be at least one element selected from S, Se and Te. In addition, L may be at least one group II element selected from a group consisting of Ba, Ca and Mg or may be at least one group I element selected from a group consisting of Li, Na, K, Rb and Cs. D may be at least one selected from S, Se and Te, and Re may be at least one selected from Y, La, Ce, Nd, Pm, Sm, Gd, Tb, Dy, Ho, Er, Tm, Yb, Lu, F, Cl, Br and I.

As such, white light having a relatively high color rendering index of 70 or higher may be provided in a form in which a specific yellow phosphor and green and red phosphors are combined in consideration of at least one of a half-width, a peak wavelength, conversion efficiency and the like. In addition, since light of several wavelength bands may be obtained through the plurality of phosphors, color reproduction characteristics may be enhanced. On the other hand, in the red phosphor described above, in the case of the silicate-based phosphor of $(Sr,L)_2SiO_{4-x}N_y:Eu$, the range of x may satisfy the condition of $0.15 \leq x \leq 3$. A portion of Si in the empirical formula described above may be substituted with a different element, for example, at least one element selected from a group consisting of B, Al, Ga and In, and unlike the description above, may be substituted with at least one element selected from a group consisting of Ti, Zr, Gf, Sn and Pb.

Then, in the case of an embodiment with reference to FIG. 13, a white light emitting device 20 may include a package body 21 having a reflective cup formed in a central portion thereof, a blue LED chip 25 mounted on the bottom of the reflective cup, and a transparent resin encapsulation unit 29 disposed within the reflective cup and encapsulating the blue LED chip 25. The resin encapsulation unit 29 may be formed of, for example, a silicon resin, an epoxy resin or a combination thereof. In the present embodiment, the resin encapsulation unit 29 may include the yellow phosphor 22 described with reference to FIG. 12 and phosphors 24 and 26 emitting a color different therefrom, for example, green or red.

On the other hand, although the embodiment described above provides the case of the form in which two or more types of phosphor powder particles are mixed with each other to be distributed in a single resin encapsulation unit, various modification embodiments through different structures may be carried out. In further detail, the above-mentioned two or three types of phosphors may have different layer structures. For example, the green phosphor, the red phosphor and the yellow or yellowish-orange phosphor may be provided as a phosphor film having at least one layer structure, for example, in ceramic plate form, by distributing phosphor powder particles at a relatively high pressure.

Unlike the description above, as shown in FIG. 14, a white light emitting device may be implemented to have a structure including a plurality of phosphor-contained resin layers. With reference to FIG. 14, a white light emitting device 30 may include a package body 31 having a reflective cup formed in a central portion thereof, a blue LED 35 mounted on the bottom of the reflective cup, and a transparent resin encapsulation unit 39 disposed within the reflective cup and encapsulating the blue LED 35, similarly to the foregoing embodiment. Resin layers containing different phosphors may be provided on the resin encapsulation unit 39. That is, a wavelength conversion unit may be configured to include a first resin layer 32 containing the green phosphor, a second resin layer 34 containing the yellow phosphor, and a third resin layer 36 containing the red phosphor. A sequence in which the first to third resin layers 32, 34 and 36 are stacked may be changed as needed.

Figure 15:
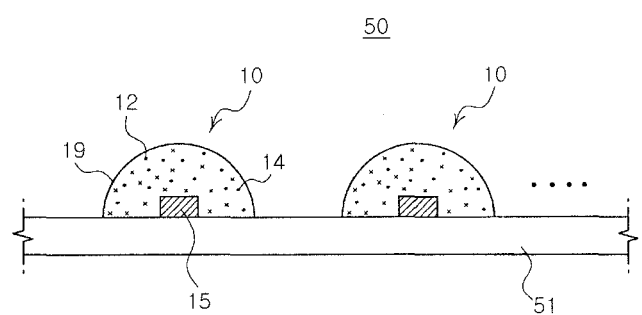
FIGS. 15 and 16 are schematic views of white light source modules according to an embodiment.
Figure 16:
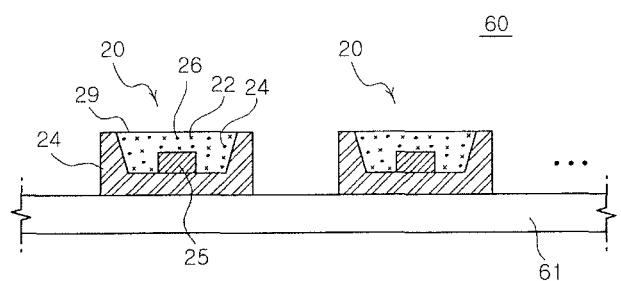

Meanwhile, a white light source module according to an embodiment of the inventive concept may be usefully employed as a light source for an LCD backlight unit. That is, the white light source module according to the embodiment may be provided as a light source for an LCD backlight unit and may be combined with several optical members, for example, a diffusion plate, alight guard plate, a reflective plate, a prism sheet, and the like, to thereby configure a backlight assembly. FIGS. 15 and 16 illustrate white light source modules as above. With reference to FIG. 15, a light source module 50 for an LCD backlight may include a circuit board 51 and a plurality of white LED devices 10 mounted thereon to be arrayed. A conductive pattern (not shown) may be formed on an upper surface of the circuit board 51 to be connected to the LED devices 10. The respective white LED device 10 illustrated in FIG. 15 may be considered to be the white LED device described with reference to FIG. 12. That is, a blue LED 15 may be directly mounted on the circuit board 51 in a chip on board (COB) scheme. The configuration of respective white LED devices 10 may include a hemispheric resin encapsulation unit 19 having a lens function without a separate reflective wall, such that respective white LED devices 10 may have relatively wide beam angles. A wide angle of the spread beam of the respective white light source may contribute to a reduction in the size, for example, a thickness or a width, of an LCD display.

With reference to FIG. 16, a light source module 60 for an LCD backlight may include a circuit board 61 and a plurality of white LED devices 20 mounted thereon to be arrayed. As described with reference to FIG. 14, the white LED device 20 may include the blue LED chip 25 mounted within the reflective cup in the package body 21 and the resin encapsulation unit 29 encapsulating the blue LED chip 25, and the resin encapsulation unit 29 may include a yellow phosphor 22 and phosphors 24 and 26 emitting a color different therefrom, for example, green or red.

Figure 17A:
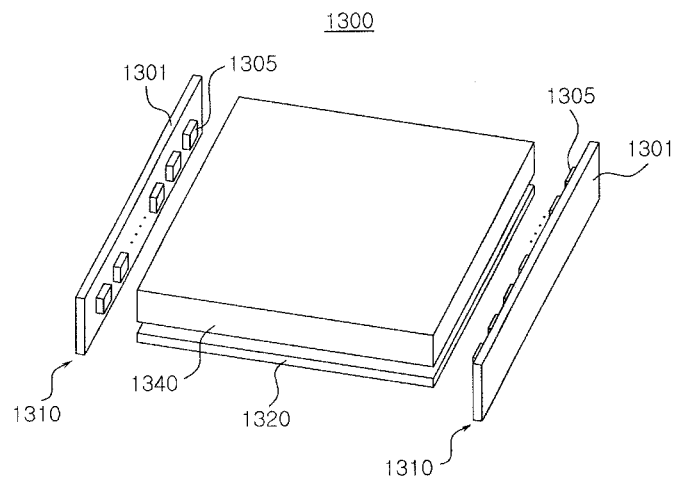
FIGS. 17A to 19B are cross-sectional views illustrating examples of backlight units according to various embodiments.
Figure 17B:
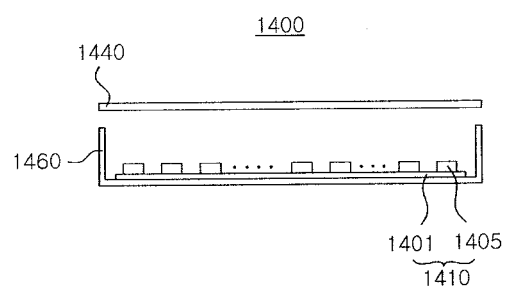

On the other hand, FIGS. 17A and 17B are cross-sectional views illustrating examples of a back light unit according to various embodiments. As an example of a backlight unit in which a light emitting diode package according to an embodiment of the inventive concept is applied as alight source, an edge-type backlight unit 1300 is illustrated in FIG. 17A. The edge-type backlight unit 1300 according to the present embodiment may include a light guide plate 1340 and LED light source modules 1310 provided on both sides of the light guide plate 1340. Although the present embodiment illustrates the example in which the LED light source modules 1310 are provided on both opposing sides of the light guide plate 1340, the LED light source module 1310 may only be disposed on a single side thereof, and unlike the description above, additional LED light source modules may also be provided on other sides. As illustrated in FIG. 17A, a reflective plate 1320 may be further provided on a lower part of the light guide plate 1340. The LED light source module 1310 used in the present embodiment may include a printed circuit board 1301 and a plurality of LED light sources 1305 mounted on the board 1301, and the LED light sources 1305 may be provided using a light emitting device package employing the foregoing phosphor, to be applied thereto.

As an example of another-type backlight unit, FIG. 17B illustrates a direct-type backlight unit 1400. The direct-type backlight unit 1400 according to the present embodiment may include a light diffusion plate 1440 and LED light source modules 1410 arrayed on a lower surface of the light diffusion plate 1440. The backlight unit 1400 illustrated in FIG. 17B may include a bottom case 1460 provided with a lower part of the light diffusion plate 1440 and receiving the light source modules. The LED light source module 1410 employed in the present embodiment may include the printed circuit board 1401 and the plurality of LED light sources 1405 mounted on an upper surface of the printed circuit board 1401. The plurality of LED light sources may be light emitting device packages using the above-mentioned phosphors as wavelength conversion materials.

Figure 18:
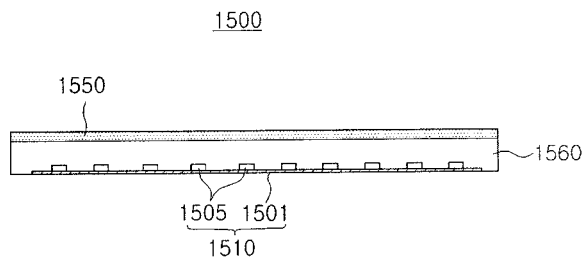

In addition to the embodiments described above, the phosphor may not be directly disposed within a package in which an LED is located, but may be disposed in a different constituent element of the backlight unit to be able to convert light. The embodiments as described above are illustrated in FIGS. 18 to 19B. First, as shown in FIG. 18, a direct-type backlight unit 1500 according to an embodiment may include a phosphor film 1550 and an LED light source module 1510 arrayed on a lower surface of the phosphor film 1550. The backlight unit 1500 illustrated in FIG. 18 may include a bottom case 1560 receiving the light source module 1510. According to the present embodiment, the phosphor film 1550 may be disposed on an upper surface of the bottom case 1560. A wavelength of at least a portion of light emitted from the light source module 1510 may be changed by the phosphor film 1550. Although the phosphor film 1550 may be manufactured as a separate film to be applied, the phosphor film 1550 may be provided in a form in which it is integrated with the light diffusion plate. Here, the LED light source module 1510 may include a printed circuit board 1501 and a plurality of LED light sources 1505 mounted on the printed circuit board 1501.

Figure 19A:
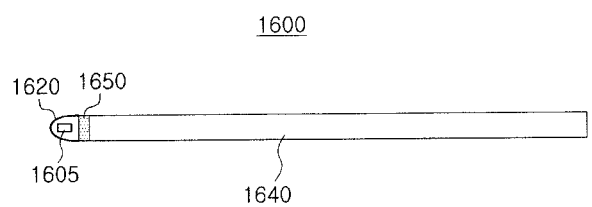
Figure 19B:
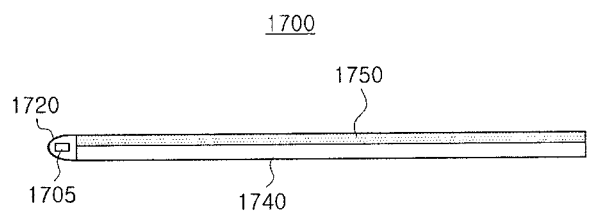

FIGS. 19A and 19B illustrate edge-type backlight units according to embodiments of the inventive concept. An edge-type backlight unit 1600 shown in FIG. 19A may include a light guide plate 1640 and an LED light source 1605 provided with one side of the light guide plate 1640. Light from the LED light source 1605 may be guided to the interior of the light guide plate 1640 through a reflective structure 1620. In the present embodiment, a phosphor film 1650 may be interposed between a side of the light guide plate 1640 and the LED light source 1605. An edge-type backlight unit 1700 shown in FIG. 19B may include a light guide plate 1740 and an LED light source 1705 and a reflective structure 1720 provided with one side of the light guide plate 1740. The present embodiment illustrates a manner in which a phosphor film 1750 is applied to a light emission surface of the light guide plate. As described above, the phosphor according to the embodiment may also be implemented to be applied to other devices such as a backlight unit or the like instead of being directly applied to the LED light source.

Figure 20:
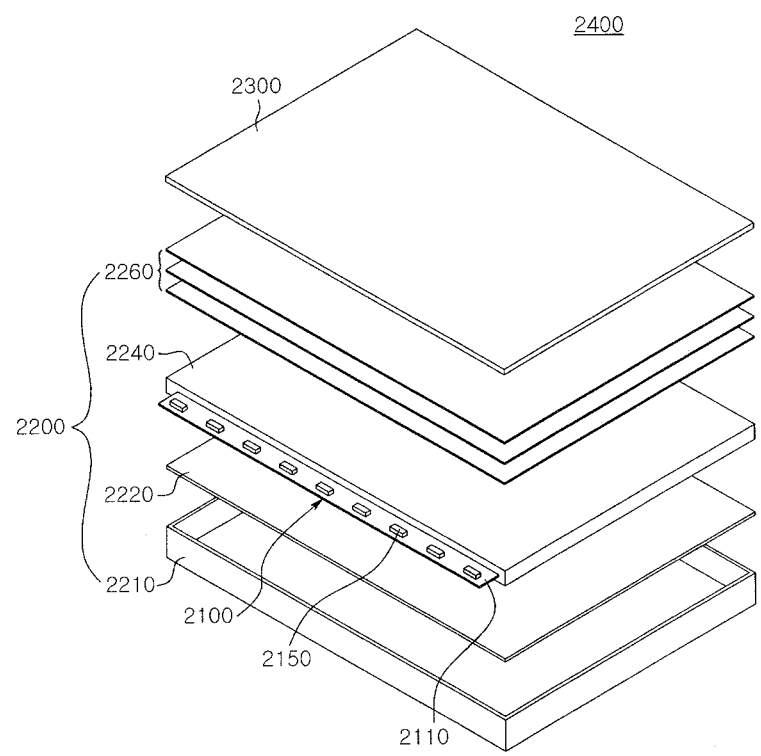
FIG. 20 is an exploded perspective view of a display device according to an embodiment.

FIG. 20 is an exploded perspective view of a display device according to an embodiment. The display device 2400 shown in FIG. 20 may include a backlight unit 2200 and an image display panel 2300 such as a liquid crystal panel. The backlight unit 2200 may include a light guide plate 2240 and an LED light source module 2100 provided on at least one side of the light guide plate 2240. In the present embodiment, the backlight unit 2200 may further include a bottom case 2210 and a reflective plate 2220 disposed below the light guide plate 2240 as shown in FIG. 20. In addition, according to the requirements for various optical characteristics, the display device may include several types of optical sheets 2260 such as a diffusion sheet, a prism sheet or a protective sheet between the light guide plate 2240 and the liquid crystal panel 2300.

The LED light source module 2100 may include a printed circuit board 2110 provided with at least one side of the light guide plate 2240 and a plurality of LED light sources 2150 mounted on the printed circuit substrate 2110 to allow light to be incident onto the light guide plate 2240. The plurality of LED light sources 2150 may be the above-mentioned light emitting device packages. The plurality of LED light sources employed in the present embodiment may be side view-type light emitting device packages of which sides adjacent to a light emission surface are mounted.

As described above, the above-mentioned phosphor may be applied to a package having various mounting structures to be applied to an LED light source module providing various types of white light. The above-mentioned light emitting device package or the above-mentioned light source module including the same may be applied to various types of display devices or illumination apparatuses.

As set forth above, according to an embodiment of the inventive concept, a high brightness α-SiAlON-based phosphor having relatively high light emission efficiency may be provided, and a white light emitting device, a surface light source device, an illumination device and a display device using the phosphor as described above may be provided.

While the inventive concept has been shown and described in connection with embodiments, it will be apparent to those skilled in the art that modifications and variations could be made without departing from the spirit and scope of the present inventive concept as defined by the appended claims.

What is claimed is:

1. A phosphor comprising an α-type $Si_3N_4$ crystal structure and comprising oxynitride represented by an empirical formula $Ca_xEu_yM_zSi_{12-(m+n)}Al_{n+m}O_nN_{16-n}$, wherein M is at least one selected from a group consisting of Sr, Lu, La and Ba, and satisfies $0.5 \leq x \leq 1.1$, $0.00005 \leq y < 0.09$, $1.0 \leq m \leq 3.6$, $0.001 \leq n \leq 0.2$, and $0.00001 \leq z \leq 0.1$.

2. The phosphor of claim 1, wherein M includes two or more types of elements selected from the group, and all of the two or more types of elements satisfy $0.00001 \leq z \leq 0.1$.

3. The phosphor of claim 1, wherein M is Sr and satisfies $0.00001 \leq z \leq 0.05$.

4. The phosphor of claim 1, wherein M is Ba and satisfies $0.00001 \leq z \leq 0.1$.

5. The phosphor of claim 1, wherein M is Lu and satisfies $0.00001 \leq z \leq 0.04$.

6. A white light emitting device comprising:
a light emitting device emitting excitation light;
a phosphor disposed in the vicinity of the light emitting device to convert a wavelength of at least a portion of the excitation light and including the empirical formula of at least one of claim 1; and
at least one light emitting element emitting a wavelength of light different from that of the light emitting device and the phosphor and provided by at least one of an additional light emitting device and a different type of phosphor.

7. The white light emitting device of claim 6, further comprising a package body including a groove part in which the light emitting device is mounted.

8. The white light emitting device of claim 6, further comprising a resin encapsulation unit encapsulating the light emitting device, at least one of the phosphor and the different type of phosphor being distributed within the resin encapsulation unit.

9. The white light emitting device of claim 6, wherein the phosphor and the different type of phosphor respectively form a plurality of different phosphor-containing resin layers, and the plurality of phosphor-containing resin layers have a stacked structure.

10. The white light emitting device of claim 6, wherein the phosphor is provided in ceramic plate form.

11. A surface light source device using, as a wavelength converting material, the phosphor of claim 1.

12. A surface light source device comprising:
a light guide plate; and
a light source module disposed on at least one side of the light guide plate to provide light to an inside of the light guide plate,
wherein the light source module includes a circuit board and a plurality of white light emitting devices mounted on the circuit board and using, as a wavelength converting material, the phosphor of claim 1.

13. A display device using, as a wavelength converting material, the phosphor of claim 1.

14. A display device comprising:
an image display panel displaying an image; and
a backlight unit providing light to the image display panel and including the surface light source device of claim 12.

15. An illumination device using, as a wavelength converting material, the phosphor of claim 1.

16. An illumination device comprising:
a light source module; and
a diffusion sheet disposed on the light source module and allowing light incident from the light source module to be uniformly diffused thereon,
wherein the light source module includes a circuit board and a plurality of white light emitting devices mounted on the circuit board and using, as a wavelength converting material, the phosphor of claim 1.

* * * * *